United States Patent [19]
Lin et al.

[11] Patent Number: 5,950,094
[45] Date of Patent: Sep. 7, 1999

[54] METHOD FOR FABRICATING FULLY DIELECTRIC ISOLATED SILICON (FDIS)

[75] Inventors: Shih-Chi Lin, Taipei; Hui-ju Yu, Hsin-Chu; Yen-Ming Chen, Hsin-Chu; Hui-Hua Chang, Hsin-Chu, all of Taiwan

[73] Assignee: Taiwan Semiconductor Manufacturing Company, Ltd., Hsin-Chu, Taiwan

[21] Appl. No.: 09/252,510

[22] Filed: Feb. 18, 1999

[51] Int. Cl.⁶ .................................................. H01L 21/76
[52] U.S. Cl. ........................ 438/409; 438/404; 438/405; 438/408; 438/424; 438/433; 438/960; 148/DIG. 50
[58] Field of Search .................................... 438/424, 433, 438/960, FOR 222, FOR 227, 405, 408, 409, 404; 148/DIG. 50

[56] References Cited

U.S. PATENT DOCUMENTS

| | | | |
|---|---|---|---|
| 3,919,060 | 11/1975 | Pogge et al. | 204/129.3 |
| 4,016,017 | 4/1977 | Aboaf et al. | 148/187 |
| 4,393,577 | 7/1983 | Imai | 29/576 B |
| 4,506,283 | 3/1985 | Soclof | 357/51 |
| 4,532,700 | 8/1985 | Kinney et al. | 29/576 W |
| 4,627,883 | 12/1986 | Holmstrom et al. | 148/187 |
| 4,982,263 | 1/1991 | Spratt et al. | |
| 5,023,200 | 6/1991 | Blewer et al. | 437/187 |
| 5,583,368 | 12/1996 | Kenney | 257/621 |

*Primary Examiner*—Wael M. Fahmy
*Assistant Examiner*—Long Pham
*Attorney, Agent, or Firm*—George O. Saile; Stephen B. Ackerman; William J. Stoffel

[57] ABSTRACT

The present invention provides a method of fabricating fully dielectric isolated silicon (FDIS) by anodizing a buried doped silicon layer through trenches formed between active areas to form a porous silicon layer; oxidizing the porous silicon layer through the trenches to form a buried oxide layer; and by depositing a dielectric in the trenches. The process begins by forming a buried doped layer in a silicon substrate defining a silicon top layer over the conductive buried doped layer. The silicon top layer and the buried doped layer are patterned to form trenches that extend into but not through the buried doped layer. The trenches define isolated silicon regions. The buried doped layer is anodized to form a porous silicon layer. The porous silicon layer is converted into a buried oxide layer by oxidation. The oxidation step also forms a liner oxide layer on the tops and sidewalls of the isolated silicon regions. Ion species can optionally be implanted into the sidewalls of the isolated silicon regions to form lightly doped regions to act as channel stops. A fill oxide layer is deposited over the buried oxide layer and the liner oxide layer. The fill oxide layer and the liner oxide layer are removed down to the level of the top of the isolated silicon regions thereby exposing a fully dielectric isolated silicon.

16 Claims, 3 Drawing Sheets

METHOD FOR FABRICATING FULLY DIELECTRIC ISOLATED SILICON (FDIS)

BACKGROUND OF INVENTION

1) Field of the Invention

This invention relates generally to fabrication of semiconductor devices and more particularly to the fabrication of fully dielectric isolated silicon.

2) Description of the Prior Art

It is often necessary for devices constructed in the same substrate to be electrically isolated from the substrate and from each other to prevent undesired interactions between them. Dielectric structures are used to provide such isolation. Various methods of forming isolation structures have been disclosed. One method of forming isolation structures is SIMOX (Separation by Implanted Oxygen). SIMOX forms a buried dielectric oxide layer by implanting oxygen ions at a particular energy level. However, a large thermal budget is required for high temperature annealing to repair the damage to the silicon layer overlying the buried oxide layer caused by implanting oxygen ions. Also, with SIMOX, a separate isolation structure must be formed between devices.

Another method for forming isolation structures comprises using an HF anodizing step to form porous silicon, then oxidizing the porous silicon. Because the HF anodizing step is highly selective to doped silicon, a porous silicon pattern can be formed without harming areas of undoped silicon where devices are to be formed. A common method of forming buried porous silicon to isolate device areas from the substrate is epitaxial growth of monocrystalline silicon over a layer of porous silicon that will subsequently be anodized. However, to prevent damage to the monocrystalline silicon, the epitaxial silicon must be formed at low temperatures resulting in a lower quality monocrystalline structure.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 3,919,060 (Pogge et al.) shows a method for dielectrically isolating silicon regions grown on a substrate using anodic etching and oxidation.

U.S. Pat. No. 4,016,017 (Aboaf et al.) shows a method for forming dielectric regions by oxidizing and densifying porous silicon on a substrate surface.

U.S. Pat. No. 4,393,577 (Imai), U.S. Pat. No. 4,532,700 (Kinney et al.), and U.S. Pat. No. 4,627,883 (Holmstrom et al.) show methods of forming devices using anodic etches.

U.S. Pat. No. 4,506,283 (Soclof) shows a method of forming resistors using an anodic treatment.

U.S. Pat. No. 5,023,200 (Blewer et al.) shows a method for forming isolated silicon regions over a conductive layer by oxidizing and densifying porous silicon, but does not provide the planarized fully dielectrically isolated silicon of the present invention.

SUMMARY OF THE INVENTION

It is an object of the present invention to provide a method of fabricating fully dielectric isolated silicon by oxidizing a buried porous silicon layer through trenches formed between active areas and by depositing a dielectric in the trenches.

It is another object of the present invention to provide a method to fabricate fully dielectric isolated silicon with a single masking step.

It is another object of the present invention to provide a method to fabricate fully dielectric isolated silicon by forming a buried oxide structure with an increased thickness using a reduced thermal budget.

It is yet another object of the present invention to provide a method to fabricate fully dielectric isolated silicon having decreased susceptability to current leakage from the walls of the active region.

To accomplish the above objectives, the present invention provides a method for fabricating fully dielectric isolated silicon. The process begins by forming a buried layer of p+ doped silicon using high energy ion implantation. Trenches are formed in the silicon overlying the buried doped layer and into but not through the buried doped silicon layer, thereby defining active areas between the trenches. The doped silicon layer is converted to a buried porous silicon layer by anodizing using HF. The buried porous silicon layer is oxidized through the trenches formed between the active areas. An optional boron implant may be performed to form a channel stop. A dielectric layer is deposited in the trenches. The dielectric layer and the active areas are planarized using chemical mechanical polishing.

The present invention provides considerable improvement over the prior art. The present invention uses only one mask to form fully dielecteric isolated silicon. Processes that grow epitaxial silicon over porous silicon generally use multiple masks. SIMOX only isolates the silicon layer from the substreate requiring a separate isolation structure between devices.

The present invention provides the ability to control the thicknesses of the buried oxide layer and the overlying silicon layer. The present invention also allows both layers to be thicker than can be acheived using the SIMOX process.

The present invention does not require the large thermal budget that is necessary with SIMOX, because the anneal following Boron ion implantation is short and can be performed at a relatively low temperature.

Because the sidewalls of the isolated silicon regions are exposed by the trenches, the inventors are able to form a channel stop by ion implantation into the sidewalls. This optional implant reduces current leakage between devices.

The present invention achieves these benefits in the context of known process technology. However, a further understanding of the nature and advantages of the present invention may be realized by reference to the latter portions of the specification and attached drawings. Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the appended claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method of fabricating fully dielectric isolated silicon by oxidizing a buried porous silicon layer through trenches formed between active areas and by depositing a dielectric in the trenches.

Figure 1:
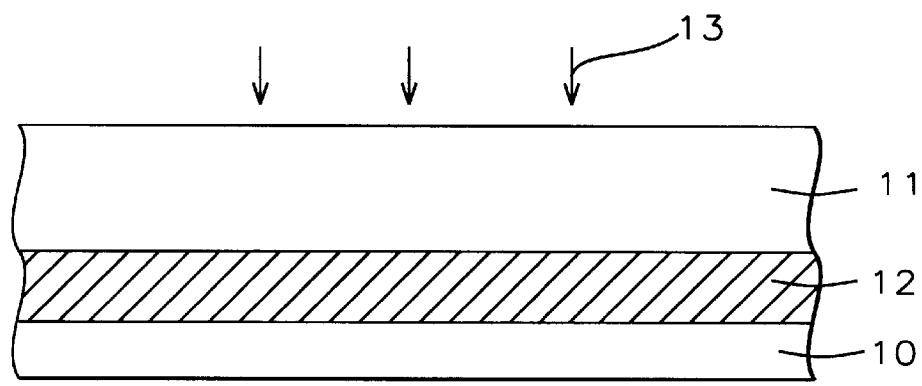
FIGS. 1, 2, 3, 4, 5, 6 & 7 illustrate sequential sectional views of the process of the current invention for fabrication of fully dielectric isolated silicon (FDIS).

Referring to FIG. 1, the process begins by providing a semiconductor substrate (10) having a monocrystalline silicon structure. The substrate (10) preferably has a P– conductivity. Boron$^{11}$ ($B^{11}$) ions are implanted into the substrate to form a buried doped layer (12). The $B^{11}$ ions are preferably implanted at an energy level of at least 300 KeV at a dose of between $10^{15}$ atoms/cm$^2$ and $10^{16}$ atoms/cm$^2$. The buried doped layer (12) is annealed using a rapid thermal process at a temperature in the range between about 850° C. and 950° C., preferably 900° C. for a time in the range between about 5 seconds and 10 seconds. Following ion implantation and annealing, a P+ buried doped layer (12) having a thickness in the range between about 3000 Angstroms and 4000 Angstroms overlies the monocrystalline silicon substrate (10) and a monocrystalline silicon top layer (11) having a thickness in the range between about 7000 Angstroms and 10000 Angstroms overlies the buried doped layer (12).

Figure 2:
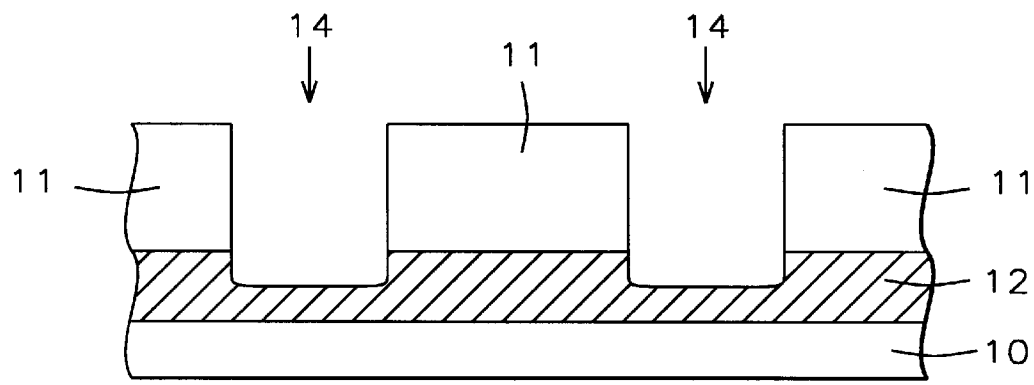

Referring to FIG. 2, the silicon top layer (11) and the buried doped layer (12) are patterned using conventional photolithography techniques to form trenches (14) that extend into but not through the buried doped layer (12). The trenches (14) separate and define isolated silicon regions (11A) having widths in the range between about 0.8 micrometers and 2 micrometers and sidewalls that are approximately perpendicular to their top surface.

An advantage of the present invention is that the use of trenches to access the buried doped layer allows for thicker and wider isolated silicon regions, as well as a thicker dielectric layer. The width of the isolated silicon regions in the present invention is primarily limited by the anodizing process.

Figure 3:
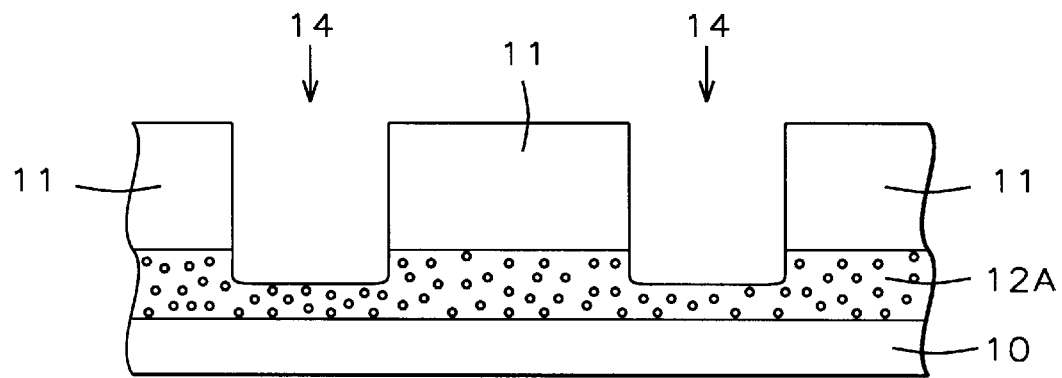

Referring to FIG. 3, the buried doped layer (12) is converted to a porous silicon layer (12A) by anodizing using HF at a concentration between about 10% and 40% with a current density between about 10 mA/cm$^2$ and 60 mA/cm$^2$. Because the anodizing process is highly selective to the high conductivity buried doped layer (12) compared to the low conductivity isolated silicon regions (11A), the isolated silicon regions are not harmed.

Figure 4:
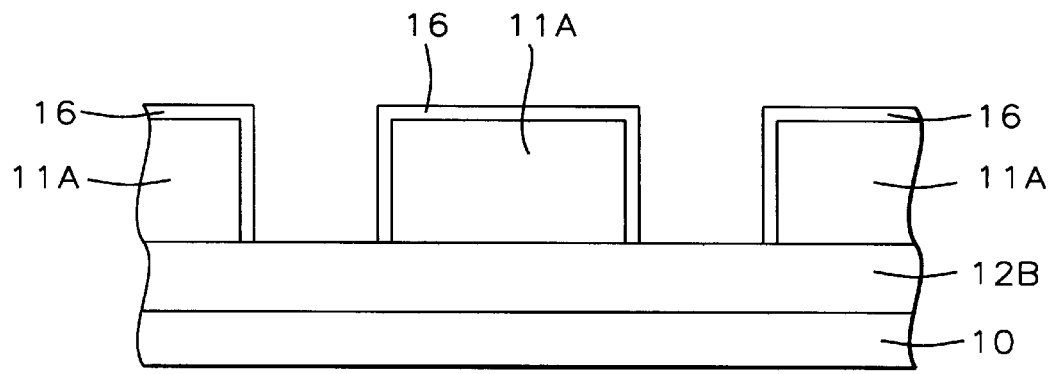

Referring to FIG. 4, the substrate is exposed to an oxidizing environment that converts the buried porous silicon layer (12A) into a dielectric buried oxide layer (12B) comprising silicon dioxide. The oxidizing environment can be wet or dry, but is preferably wet.

A key consideration is the temperature used for the oxidation process. In the present invention, the porous silicon layer (12A) is oxidized at a sufficient temperature to completely oxidize the porous silicon, as well as, to thermally grow a liner oxide layer (16) on the top surface and sidewalls of the isolated silicon regions (11A). Preferably, oxidation is performed at a temperature in the range between about 950° C. and 100° C. for a time in the range between 10 minutes and 20 minutes.

Figure 5:
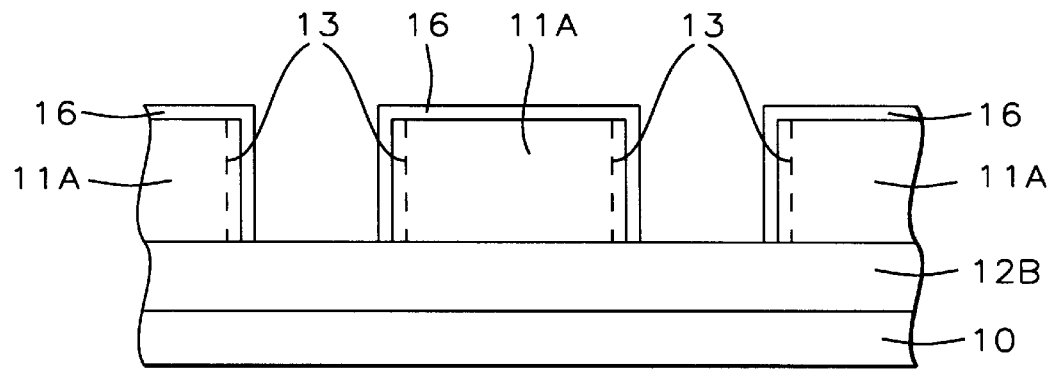

Referring to FIG. 5, an optional light Boron can be implanted into the sidewalls of the isolated silicon regions to act as a channel stop. The light Boron implant is preferably performed at a sufficient angle to prevent ions from penetrating the thermal oxide layer (16) on the top surface of the isolated silicon regions. The implant angle is preferably in the range between about 7 degrees and 45 degrees. The Boron ions are preferably implanted at a dose of between $10^{12}$ atm/cm$^2$ and $5 \times 10^{13}$ atm/cm$^2$ with an energy between about 20 KeV and 25 KeV.

Figure 6:
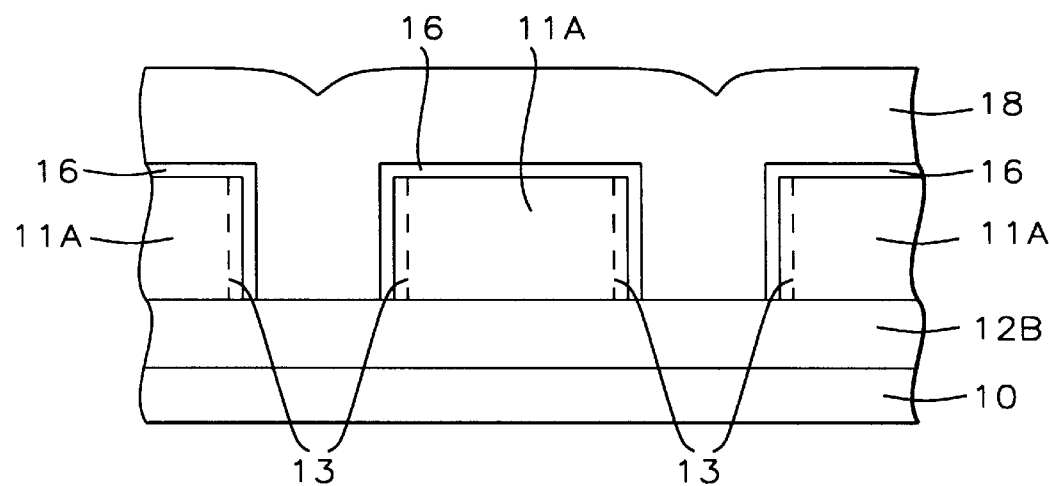

Referring to FIG. 6, a fill dielectric layer (18) is deposited over the buried oxide layer (12B) and over the liner oxide layer (16). The fill dielectric layer (18) is preferably deposited to a thickness suficient to fill the trench to the level of the top of the isolated silicon regions. The fill dielectric layer (18) is preferably composed of silicon dioxide which can be formed using TEOS or more preferably a conventional CVD process.

Figure 7:
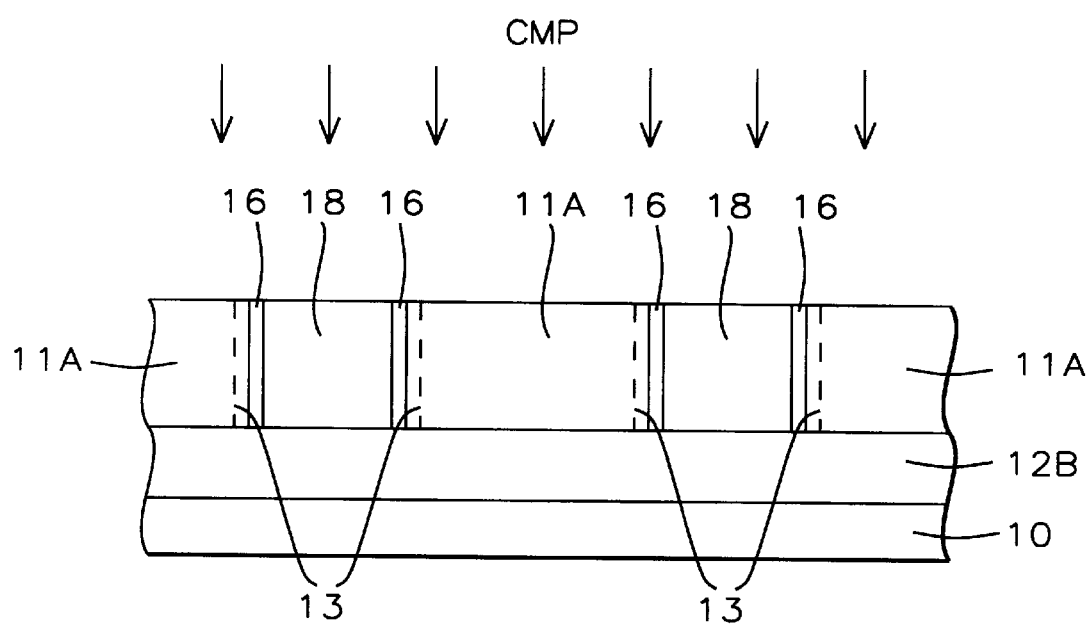

Referring to FIG. 7, the fill dielectric layer (18) and the liner oxide layer (16) are removed to the level of the top of the isolated silicon regions (11A), preferably using a conventional chemical-mechanical processing (CMP) technique. The CMP exposes fully dielectric isolated silicon (FDIS) suitable for fabricating semiconductor devices. The isolated silicon regions (11A) act as a CMP stop.

While the invention has been particularly shown and described with reference to the preferred embodiments thereof, it will be understood by those skilled in the art that various changes in form and details may be made without departing from the spirit and scope of the invention.

What is claimed is:

1. A method for fabricating Fully Dielectric Isolated Silicon comprising the steps of:
   a. forming a buried doped layer in a silicon substrate to define a silicon top layer over said buried doped layer;
   b. patterning said silicon top layer and said buried doped layer to form trenches and isolated silicon regions; said trenches extending into but not through said buried doped layer; said isolated silicon regions having sidewalls and tops;
   c. converting said buried doped layer into a porous silicon layer;
   d. oxidizing said substrate to convert said porous silicon layer into a buried oxide layer and to form a liner oxide layer on said tops and said sidewalls of said isolated silicon regions;
   e. depositing a fill dielectric layer over said buried oxide layer and over said liner oxide layer; and
   f. planarizing said fill dielectric layer and said liner oxide layer.

2. The method of claim 1 wherein said buried doped layer is formed by implanting $B^{11}$ at a dose of between $10^{15}$ atm/cm$^2$ and $10^{16}$ atm/cm$^2$ with an energy of at least 300 KeV and rapid thermal annealing said buried doped layer at temperature between 850° C. and 950° C. for a time in the range between about 5 seconds and 10 seconds.

3. The method of claim 1 wherein said trenches have a width between about 0.8 micrometers and 2 micrometers.

4. The method of claim 1 wherein the conversion in step c is a anodization process performed using BF at a concentration of between about 10% and 40% with a current density of between about 10 mA/cm$^2$ and 60 mA/cm$^2$.

5. The method of claim 1 wherein the oxidation in step d is performed at a temperature between 950° C. and 1000° C.

6. The method of claim 1 wherein said fill dielectric layer is deposited by chemical vapor deposition to a sufficient depth to fill said trenches to a level above said liner oxide layer.

7. The method of claim 1 which further includes after step d and before step e, implanting ion species into said sidewalls of said isolated silicon regions to form lightly doped regions.

8. The method of claim 1 wherein said buried doped layer has an ion concentration of between about $10^{19}$ atm/cm$^3$ and $10^{21}$ atm/cm$^3$; said buried doped layer has a thickness of between about 3000 Angstroms and 4000 Angstroms; and said top silicon layer has a thickness of between about 7000 Angstroms and 10000 Angstroms.

9. A method for fabricating Fully Dielectric Isolated Silicon comprising the steps of:
   a. forming a buried doped layer in a silicon substrate; defining a silicon top layer over said buried doped layer;
   b. patterning said silicon top layer to form trenches that expose areas of said buried doped layer and form isolated silicon regions; said isolated silicon regions having tops and sidewalls;
   c. anodizing said buried doped layer to form a porous silicon layer;
   d. oxidizing said substrate to convert said porous silicon layer into a buried oxide layer and forming a liner oxide layer on the tops and sidewalls of said isolated silicon regions;
   e. implanting ion species into said sidewalls of said isolated silicon regions to form lightly doped regions;
   f. depositing a fill dielectric layer over said buried oxide layer and over said liner oxide layer; and
   g. chemical-mechanical polishing (CMP) said fill dielectric layer and said liner oxide layer using said isolated silicon regions as an etch stop; thereby exposing a fully dielectric isolated silicon.

10. The method of claim 9 wherein the heavily doped layer is formed by implanting B$^{11}$ at a dose of between about $10^{15}$ atm/cm$^2$ and $10^{16}$ atm/cm$^2$ with an energy of greater than 300 KeV and a rapid thermal anneal at temperature of between about 850° C. and 950° C.

11. The method of claim 9 wherein said trenches have a width between 0.8 micrometers and 2 micrometers.

12. The method of claim 9 wherein the anodization in step c. is performed using BF at a concentration of between about 10% and 40% with a current density of between about 10 mA/cm$^2$ and 60 mA/cm$^2$.

13. The method of claim 9 wherein the oxidation is performed at a temperature between 950° C. and 1000° C.

14. The method of claim 9 wherein said fill dielectric layer is deposited by chemical vapor deposition to a sufficient depth to fill said trenches to above said liner oxide layer.

15. The method of claim 9 wherein said ion species implanted in said isolated silicon region sidewalls is Boron, implanted at a dose of between $10^{12}$ atm/cm$^2$ and $5\times10^{13}$ atm/cm$^2$ with an energy between about 20 KeV and 25 KeV.

16. The method of claim 9 wherein said buried doped layer has an ion concentration of between about $10^{19}$ atm/cm$^3$ and $10^{21}$ atm/cm$^3$; said buried doped layer has a thickness of between about 3000 Angstroms and 4000 Angstroms; and said top silicon layer has a thickness of between about 7000 Angstroms and 10000 Angstroms.

\* \* \* \* \*